United States Patent
Sir et al.

(10) Patent No.: US 6,946,737 B2
(45) Date of Patent: Sep. 20, 2005

(54) ROBUST INTERLOCKING VIA

(75) Inventors: Jiun Hann Sir, Penang (MY); Kian Sin Sim, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/917,140

(22) Filed: Aug. 11, 2004

(65) Prior Publication Data

US 2005/0085067 A1 Apr. 21, 2005

Related U.S. Application Data

(62) Division of application No. 10/691,135, filed on Oct. 21, 2003.

(51) Int. Cl.[7] ............................................. H01L 23/48
(52) U.S. Cl. ..................... 257/773; 257/774; 257/775; 257/780; 257/781; 257/698
(58) Field of Search ................................. 257/773–775, 257/780–781, 698

(56) References Cited

U.S. PATENT DOCUMENTS

| | | | |
|---|---|---|---|
| 5,129,142 A | 7/1992 | Bindra et al. .................. 29/852 |
| 5,191,709 A | 3/1993 | Kawakami et al. ........... 29/852 |
| 5,293,504 A | 3/1994 | Knickerbocker et al. ... 174/262 |
| 6,079,100 A | 6/2000 | Farquhar et al. .............. 29/852 |
| 6,335,565 B1 * | 1/2002 | Miyamoto et al. .......... 257/686 |
| 6,441,494 B2 * | 8/2002 | Huang et al. ................ 257/774 |

* cited by examiner

*Primary Examiner*—Luan Thai
(74) *Attorney, Agent, or Firm*—Blakely, Sokoloff, Taylor & Zafman

(57) ABSTRACT

The invention provides a via with improved resistance to failures due to delamination voids. In one embodiment, the via may extend from above to below a bottom conductor and include an anchor section. The anchor section may mechanically interlock the via with the bottom conductor to prevent the via from being detached from the bottom conductor.

9 Claims, 7 Drawing Sheets

ROBUST INTERLOCKING VIA

This is a divisional application of Ser. No. 10/691,135, filed Oct. 21, 2003 which is presently pending.

BACKGROUND

1. Field of the Invention

This invention relates to vias, and more particularly to use of a via interconnect that interlocks with a conductive layer to prevent delamination.

2. Background of the Invention

As the size of semiconductor devices decrease, the density of semiconductor devices increases, and the interconnect density within substrates and printed circuit board ("PCB") increases. To provide such increased interconnections, the interconnect dimensions and spacing decrease, and the number of interconnect layers increase. Multiple interconnect layers may be fabricated so that conductive layers are separated by dielectric layers. A via in a semiconductor substrate or PCB provides an electrical connection between conductors on different layers of the substrate or PCB. For example, a via may provide an electrical connection from the surface of the substrate or PCB to a conductive trace within the substrate or PCB.

FIG. 1 is a side cross section view of a via 102 that electrically connects a top conductor 110 (plane or trace) with a bottom conductor 106 (plane or trace). The top conductor 110 is separated from the bottom conductor 106 by a dielectric layer 104. The via 102 is meant to extend through the dielectric layer 104 from the top conductor 110 to make contact with the top of the bottom conductor 106 to connect the top conductor 110 with the bottom conductor 106. However, thermal expansion of the dielectric layer 104 can produce a vertical tensile stress on the via 102. This stress can cause the bottom of the via 102 to detach from the bottom conductor 106, creating a delamination void 108. This delamination void 108 means that the via 102 does not correctly electrically connect the conductor 110 to the bottom conductor 106. Semiconductor substrates and PCBs with such delamination voids 108 likely will not work correctly.

DETAILED DESCRIPTION

References throughout this specification to "one embodiment" or "an embodiment" means that a feature, structure, material, or characteristic described in connection with the invention is included in at least one embodiment of the invention. Thus, the appearances of the phrases "in one embodiment" or "in an embodiment" in various places throughout this specification are not necessarily all referring to the same embodiment or invention. Furthermore, the features, structures, materials, or characteristics may be combined in any suitable manner in one or more embodiments.

Figure 1:
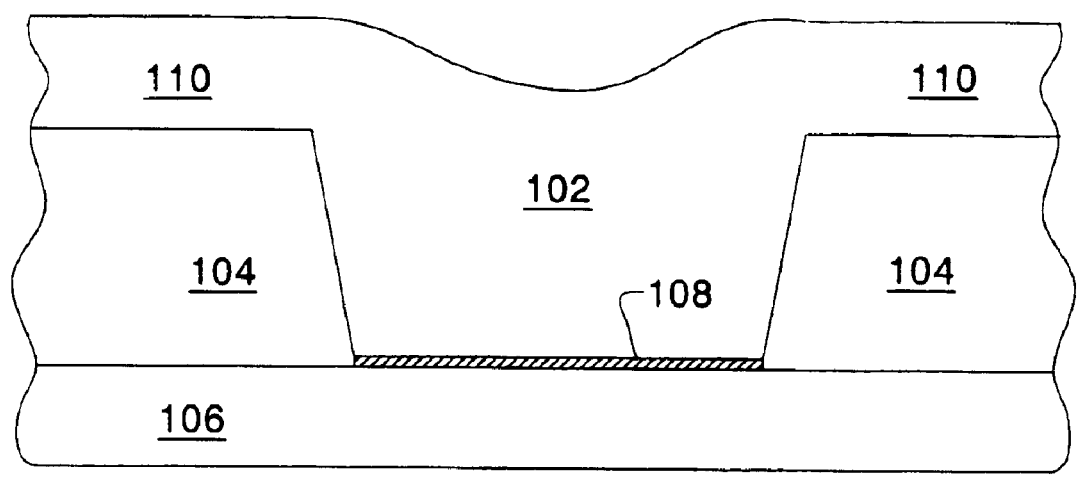
FIG. 1 is a side cross section view of a via that electrically connects a top conductor with a bottom copper trace.
Figure 2A:
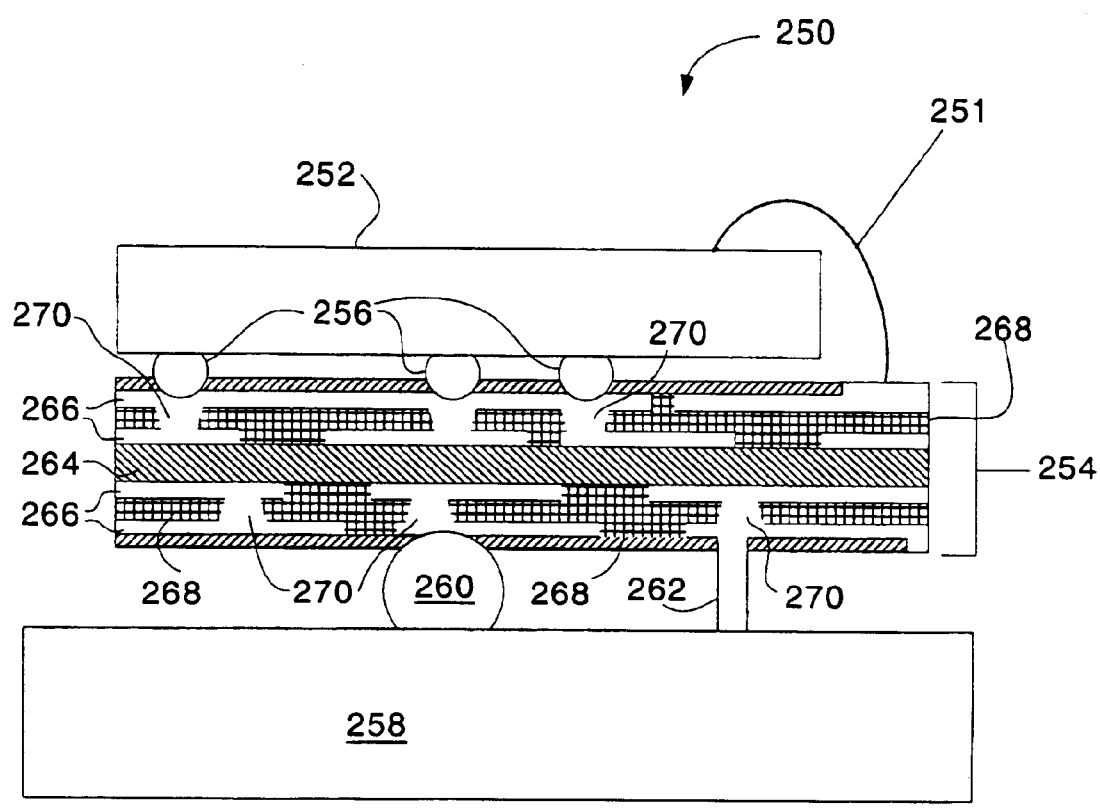
FIG. 2A is a side cross section view of an integrated circuit assembly in which an embodiment of the present invention may be used.

FIG. 2A is a side cross section view of an integrated circuit assembly 250 in which an embodiment of the present invention may be used. A silicon die 252 may be connected to a substrate 254 by structures such as solder balls 256 or wire bonds 251. The substrate 254 may be connected to a printed circuit board ("PCB") 258 by connectors such as solder balls 260 or pins 262. The substrate 254 may have a core 264, conductive layers 266, and dielectric material 268 separating the conductive layers 266. In the illustrated example, the substrate 254 has a core 264 and two conductive layers 266 on both the top and bottom of the core 264. The conductive layers 266 may comprise copper. The dielectric material 268 insulates the conductive layers 266 from each other. Vias 270 provide electrical connections between different conductive layers 266 that are separated by dielectric material 268. The PCB 258 may have a similar structure to the substrate 254.

Figure 2B:
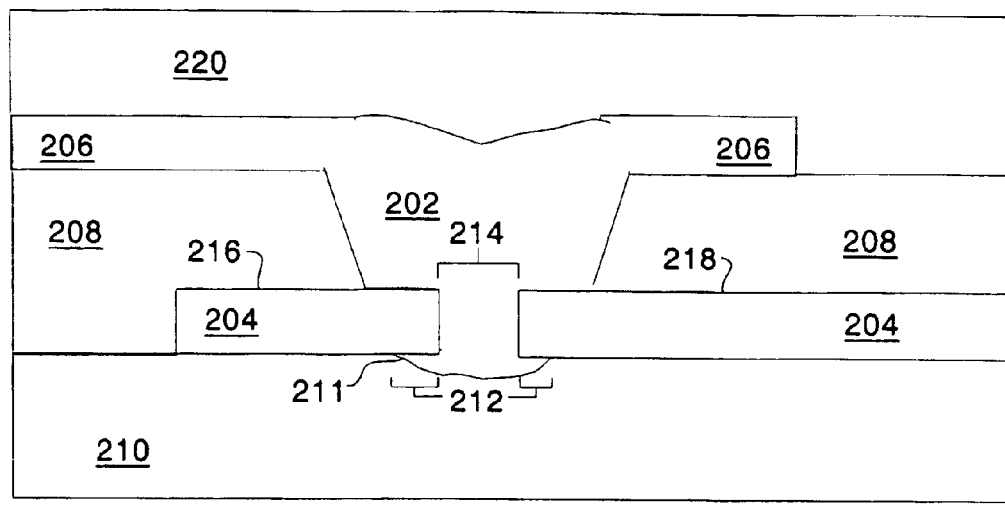
FIG. 2B is a side cross section view providing more detail of an embodiment of a via.

FIG. 2B is a side cross section view providing more detail of an embodiment of a via 202, such as might be used as one of the vias 270 in the integrated circuit assembly 250 of FIG. 2A. There may be a first dielectric layer 210. In various embodiments, this first dielectric layer 210 may comprise a resin composite material, such as glass fibers in a hydrocarbon/ceramic matrix, glass fibers in a thermoset polyester matrix, a resin material, such as an epoxy, an epoxy-acrylate mixed resin, or other materials. In an embodiment, the first dielectric layer 210 is approximately 30 micrometers thick, although it may have other thicknesses in other embodiments. Over at least part of the first dielectric layer 210 may be a bottom conductor 204. The bottom conductor 204 may be copper in some embodiments, and may also be other conductive materials such as aluminum or nickel in other embodiments. The bottom conductor 204 may be a conductive trace, a conductive plane, or another conductor. In an embodiment, the bottom conductor 204 may have a thickness in a range from about 15 micrometers to about 25 micrometers, although it may have a different thickness in other embodiments.

As illustrated in the cross section of FIG. 2B, the bottom conductor 204 may have a first section 216 and a second section 218. The first section 216 may be on the left of a via hole 214 and the second section 218 on the right of the via hole 214. The via hole 214 may be an opening through the bottom conductor 204 defined by the side walls of the bottom conductor 204. The via hole 214 may have a width in a range from about 35 micrometers to about 45 micrometers in an embodiment, although it may have a different width in different embodiments. The via 202 may substantially fill the via hole 214.

Figure 2C:
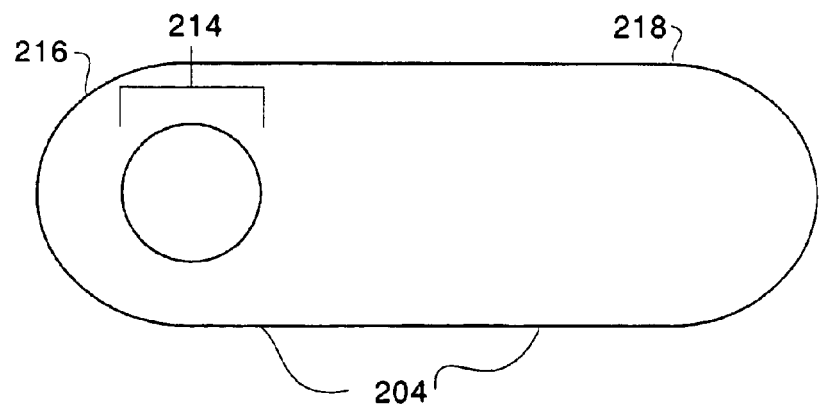
FIG. 2C is a top view that illustrates the bottom conductor and via hole.

While bottom conductor 204 appears to be in two discrete sections 216, 218 in FIG. 2B, the via hole 214 may be a hole through a larger contiguous bottom conductor 204 in some embodiments. FIG. 2C is a top view of the bottom conductor 204 that illustrates an embodiment where the bottom conductor 204 is a single contiguous piece of conductive material, with a via hole 214 that does not split the first section 216 and the second section 218 of the bottom conductor 204 into two physically separate sections. Side walls of the bottom conductor 204 define the via hole 214. While the via hole 214 is round in FIG. 2C, it may also be a different shape.

Returning to FIG. 2B, there may be a second dielectric layer 208 above the bottom conductor 204. In various embodiments, this second dielectric layer 208 may comprise a resin composite material, such as glass fibers in a hydrocarbon/ceramic matrix, glass fibers in a thermoset polyester matrix, a resin material, such as an epoxy, an epoxy-acrylate mixed resin, or other materials. In an embodiment, the second dielectric layer 208 is approximately 30 micrometers thick, although it may have other thicknesses in other embodiments. The second dielectric layer 208 may be a different dielectric material and have a different thickness than the first dielectric layer 210, or both dielectric layers 210, 208 may comprise the same dielectric material at approximately the same thickness. In some embodiments, such as that illustrated in FIG. 2B, the bottom conductor 204 may not cover the entire first dielectric layer 210. In such embodiments, the second dielectric layer 208 may be above and adjacent to the first dielectric layer 210 in areas where the bottom conductor 204 is not above the first dielectric layer 210, although the second dielectric layer 208 is still considered above the bottom conductor 204.

The second dielectric layer 208 may separate the bottom conductor 204 from a top conductor 206, which may be over at least part of the second dielectric layer 208. The top conductor 206 may be copper in some embodiments, and may also be other conductive materials such as aluminum or nickel in other embodiments. The top conductor 206 may be a conductive trace, a conductive plane, or another conductor. In an embodiment, the top conductor 206 may have a thickness in a range from about 15 micrometers to about 25 micrometers, although it may have a different thickness in other embodiments. The via 202 may extend from the top conductor 206, through the second dielectric layer 208, through the bottom conductor 204, and protrude below a lower surface of the bottom conductor 204. In an embodiment, the via 202 may comprise a copper material. In other embodiments, the via 202 may comprise aluminum or other materials. Below the lower surface of the bottom conductor 204, the via 202 has an "anchor" section 211 that may be wider than the via hole 214 so that there is an overlap section 212 beyond the side wall of the bottom conductor 204. In an embodiment, the width of the anchor section 211, which may include the widths of the overlap sections 212 as well as the width of the via hole 214 may range from about 69 micrometers to about 75 micrometers. In another embodiment, the width of the anchor section 211 may range from about 62 micrometers to about 82 micrometers. In yet other embodiments, the width of the anchor section 211 may have a different size. In some embodiments, this anchor section 211 with the overlap sections 212 may form the shape of an anchor when viewed in cross section as in FIG. 2A. The anchor section 211 with its overlap sections 212 acts as a physical interlock, or anchor, to prevent vertical tensile stresses from detaching the via 202 from the bottom conductor 204. In an embodiment, the via 202 may be wider than the via hole 214 both above and below the bottom conductor 204. When a vertical tensile stress acts on the via 202, the overlap section 212 may prevent the via 202 from moving up in relation to the bottom conductor 204, to maintain electrical contact.

In another embodiment, the via 202 is not wider above the via hole 214, but still may have an anchor section 211 that is wider than the via hole 214 below the bottom conductor 204 and that may prevent the via 202 from becoming detached from the bottom conductor 204 under influence of a vertical tensile stress. In yet another embodiment, the via 202 does not extend all the way through the bottom conductor 204 and thus does not have an anchor section 211. However, in this embodiment, the via 202 may extend far enough into the bottom conductor 204 that even if vertical stresses cause the via 202 to move upward in relation to the bottom conductor 204, the side walls of the bottom conductor 204 may still maintain contact with the side walls of the portion of the via 202 that extends into the bottom conductor 204.

In the embodiment illustrated in FIG. 2B, there is a third dielectric layer 220 above the top conductor 206, via 202, and second dielectric layer 208. Other embodiments may not include such a third dielectric layer 220. The third dielectric layer 220 may be a different dielectric material from the first dielectric layer 210 or the second dielectric layer 208, or may comprise the same dielectric material as one or both of the other dielectric layers 208, 210. The third dielectric layer 220 may have approximately the same thickness as either or both of the first and second dielectric layers 210, 208, or may have a different thickness. One or more additional conductors may also be above the third dielectric layer 220, with one or more additional vias 202 that may electrically connect the additional conductor(s) to the top conductor 206 or bottom conductor 204. Such vias 202 may be similar to the via 202 described above.

Figure 3A:
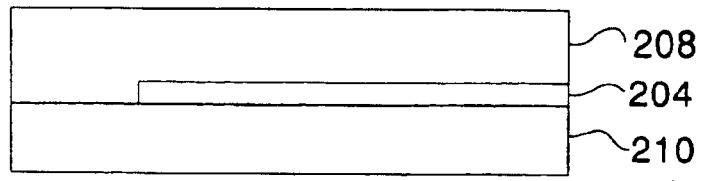
FIGS. 3A through 3L are cross sectional side views that illustrate how a via may be fabricated in one embodiment.

FIGS. 3A through 3L are cross sectional side views that illustrate how an improved via 202, such as that illustrated in FIG. 2A, may be fabricated in an embodiment. FIG. 3A is a cross sectional side view that illustrates the first dielectric layer 210, the bottom conductor 204 above part of the first dielectric layer 210, and the second dielectric layer 208 above the first dielectric layer 210 and the bottom conductor 204. In an embodiment, the first dielectric layer 210 may be formed by laminating a sheet of dielectric to a substrate (not shown). The bottom conductor 204 may be deposited on the first dielectric layer 210 by first electrolessly plating copper on the first dielectric layer 210 then using bulk electrolytic plating to add copper to the copper that was electrolessly plated. The second dielectric layer 208 may be formed by laminating a sheet of dielectric on to the bottom conductor 204 and first dielectric layer 210. Other methods may also be used to form the first dielectric layer 210, the bottom conductor 204, and the second dielectric layer 208.

Figure 3B:
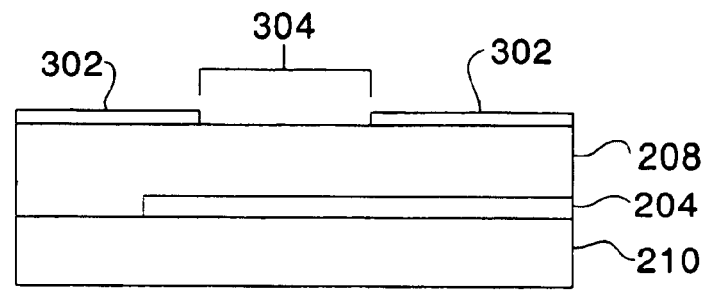

In FIG. 3B there is a dry film layer 302 over portions of the second dielectric layer 208. The dry film layer 302 may be a layer of polymeric photoresist material, or another material. There may be a dry film layer gap 304 in which the dry film layer 302 does not cover the second dielectric layer 208. The gap 304 may have a width in a range from about 69 micrometers to about 75 micrometers. In another embodiment, the width of the gap 304 may range from about 62 micrometers to about 82 micrometers. In yet other embodiments, the width of the gap 304 may have a different size. In one embodiment, the dry film layer 302 and the dry film layer gap 304 may be formed by applying a layer of dry film over the surface of the second dielectric layer 208, including the area of the dry film layer gap 304. The dry film layer 302 may be formed by laminating a sheet of dry film onto a surface of the second dielectric layer 208. A mask and light may be used to develop the applied dry film in a desired pattern that defines the dry film layer 302, including the dry film layer gap 304. In one embodiment, ultra-violet (UV) light may be used to develop the pattern. Dry film stripping may then remove the unwanted applied dry film. The stripping process removes dry film from the area of the dry film layer gap 304 to form the dry film layer 302 and the dry film layer gap 304. The results may be as illustrated in FIG. 3B: a layer of dry film 302 that covers part of the second dielectric layer 208, and a gap 304 in the dry film layer 302 that leaves an exposed portion of the second dielectric layer 208.

Figure 3C:
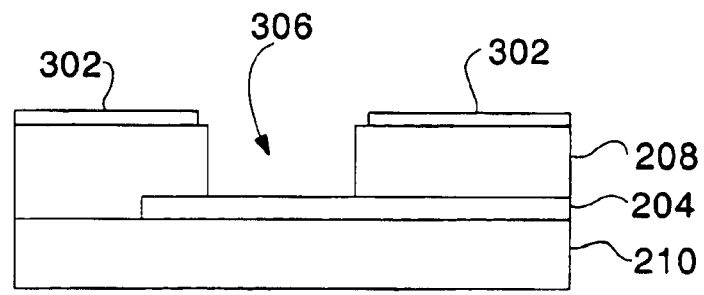

In FIG. 3C there is a first well 306 or opening through the second dielectric layer 208 to the bottom conductor 204. In some embodiments, the first well 306 may extend a small distance into the bottom conductor 204 or may not quite extend all the way to the bottom conductor 204. In an embodiment, a laser may remove a section of the second dielectric layer 208, to create the first well 306 through the second dielectric layer 208 to the bottom conductor 204. In an embodiment, a $CO_2$ laser with a wavelength of about 10.6 micrometers may be used to create the first well 306. The width of the beam may be controlled by a physical aperture of the laser. The first well 306 is defined on the sides by side walls of the second dielectric layer 208 formed as the laser removes the second dielectric layer 208, and has a depth defined by the depth of material removed by the laser, which may be approximately equal to the distance between a top surface of the second dielectric layer 208 and the top surface of the bottom conductor 204. In an embodiment, the width of the first well 306 is less than or equal to the width of the gap 304 in the dry film layer 302.

Figure 3D:
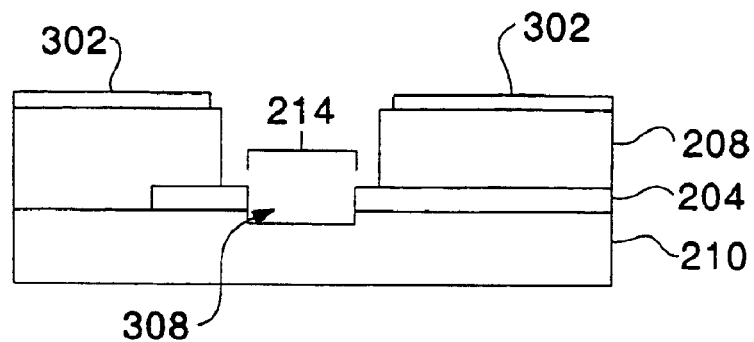

In FIG. 3D there is a second well 308 or opening through the bottom conductor 204 and extending into the first dielectric layer 210. In some embodiments, the second well 308 may not extend into the first dielectric layer 210. In an embodiment, a laser with a smaller beam than that used to create the first well 306 may remove a section of the bottom conductor 204 and first dielectric layer 210 to create the second well 308. In an embodiment, the laser may be an ultraviolet ("UV") laser with a wavelength of about 266 nanometers. The laser may have a pulse width of 3.5 nanoseconds, and may be applied for about 0.3 milliseconds, depending on the depth of the second well 308 to be created. An aperture may be used to result in the second well 308 having a width of about 35 micrometers to about 45 micrometers in an embodiment, although it may have a different width in different embodiments. The second well 308 may be defined on the sides by side walls of the bottom conductor 204 and side walls of the first dielectric layer 210 formed as the laser removes the bottom conductor 204 and the first dielectric layer 210, and may have a depth defined by the depth of material removed by the laser. In an embodiment, the second well 308 may extend about 10 micrometers below the bottom conductor 204 into the first dielectric layer 210. The via hole 214 through the bottom conductor 204 as illustrated in FIG. 2B may be created by the creation of the second well 308. In an embodiment, the width of the second well 308 is less than or equal to the width of the first well 306.

Figure 3E:
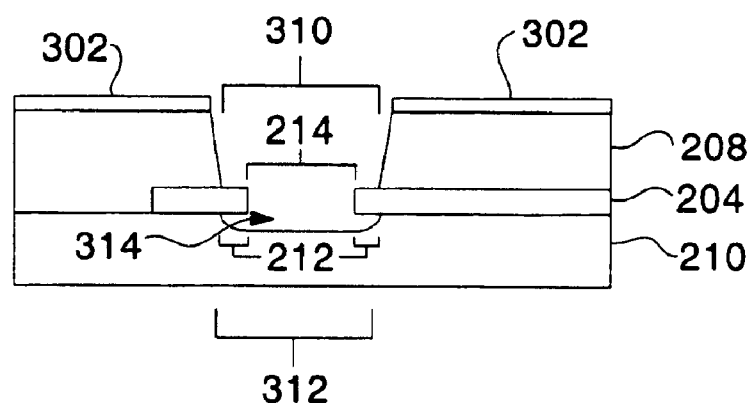

In FIG. 3E material has been removed from the first dielectric layer 210 and the second dielectric layer 208. The material may be removed with an isotropic etching process in an embodiment. This etching process may be a wet etch. In an embodiment, a solution of Mn+7, NaOH, and Mn+6 or a solution of $NaMnO_4$ and NaOH with a concentration in a range of about 60 to 70 grams per liter may be applied at a temperature in a range of about 75 to 85 degrees Celsius for about 9.5 to about 10.5 minutes. In an embodiment, a solution may be applied with a concentration of about 65 grams per liter at a temperature of about 80 degrees Celsius for about 10 minutes. The dry film layer 302 may protect the second dielectric layer 208 beneath the dry film layer 302 from being etched by the etching process. This etching process may remove residue left behind by the laser beams that create the first and second wells 306, 308 and may roughen exposed surfaces of the first dielectric layer 210 and the second dielectric layer 208, to provide good adhesion for a layer of copper. The etching process may remove material from the first well 306 through the second dielectric layer 208 to result in a first width 310 at the bottom of the first well 306. The first width 310 may be wider than the width of the via hole 214. The etching process may not substantially widen the width of the via hole 214 through the bottom conductor 204. At the bottom of the second well 308, in a lower portion of the second well 308 that is defined by the edges of the first dielectric layer 210, the etching process also may remove material from the first dielectric layer 210. The isotropic etching process may remove material from the sides as well as the bottom of the second well 308. Material removed from the sides of the second well 308 may result in an "anchor" volume 314 beneath the bottom conductor 204 with a second width 312. In an embodiment, the width 312 of the anchor volume 314, which may include the widths of the overlap sections 212 as well as the width of the via hole 214 may range from about 69 micrometers to about 75 micrometers. In another embodiment, the width 312 of the anchor volume 314 may range from about 62 micrometers to about 82 micrometers. In yet other embodiments, the width 312 of the anchor volume 314 may have a different size. The anchor volume 314 may be a volume or cavity that has a width larger than the via hole 214 so that when filled with a conductive material, a resulting anchor section 211 forms a mechanically interlocking connection between the via 202 and the bottom conductor 204 to prevent delamination voids.

Figure 3F:
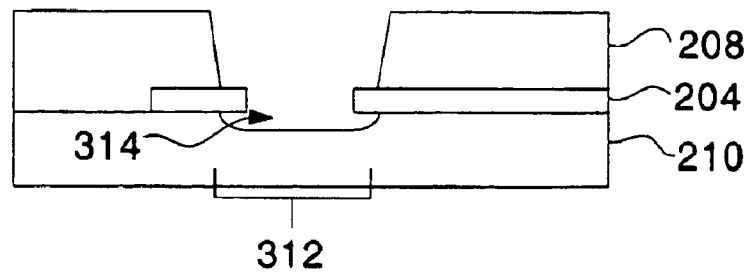

In FIG. 3F the remaining dry film layer 302 has been removed. In an embodiment, the dry film layer 302 may be removed with a chemical stripping process.

Figure 3G:
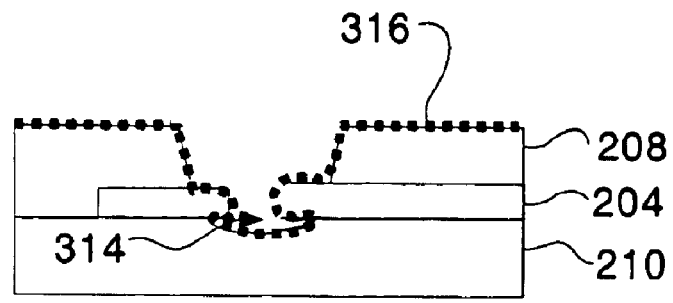

In FIG. 3G a thin conductive layer 316 has been added to exposed surfaces. In the illustrated embodiment, the exposed surfaces include the top surface of the second dielectric layer 208, the side wall and bottom surfaces of the first well 306, the side walls of the via hole 214 through the bottom conductive layer 204, and the surfaces of the anchor volume 314. In other embodiments, copper may be added to other exposed surfaces. In an embodiment, the thin conductive layer 316 may comprise copper. In an embodiment, the thin conductive layer 316 may be applied by an eletroless plating process. Other conductors, such as nickel, may also be added to exposed surfaces in place of or in addition to copper. In an embodiment, the thin conductive layer 316 may be about 0.6 micrometers to about 0.7 micrometers thick.

Figure 3H:
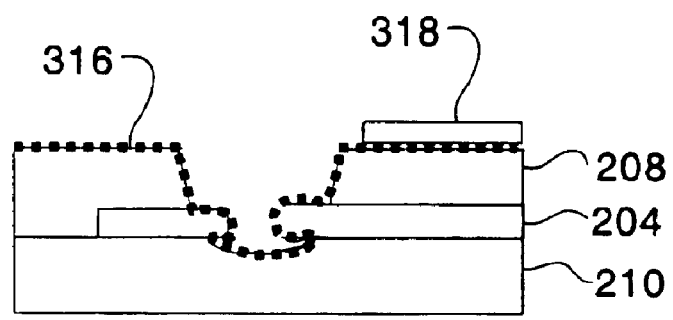

In FIG. 3H there is a second dry film layer 318 over a portion of the thin conductive layer 316 and the second dielectric layer 208. In an embodiment, the second dry film layer 318 does not cover the portion of the thin conductive layer 316 and the second dielectric layer 208 on which the top conductor 206 will be added; nor does the second dry film layer 318 cover the first well 306, the sides of the via hole 214, or the anchor volume 314. In one embodiment, the second dry film layer 318 may be formed by applying a layer of dry film on the exposed surfaces, which will typically include the entire surface of second dielectric layer 208, the exposed portions of the bottom conductor 204, and the exposed portion of the first dielectric layer 210. A mask and light may be used to develop the applied dry film in a desired pattern that defines the second dry film layer 318 over the thin conductive layer 316 and the second dielectric layer 208. Dry film stripping may then remove the unwanted applied dry film. The stripping process may remove dry film from the exposed portions of the bottom conductor 204, the exposed portion of the first dielectric layer 210, and portions of the second dielectric layer 208 on which no dry film is desired. After the stripping process, the second dry film layer 318 may be left behind.

Figure 3I:
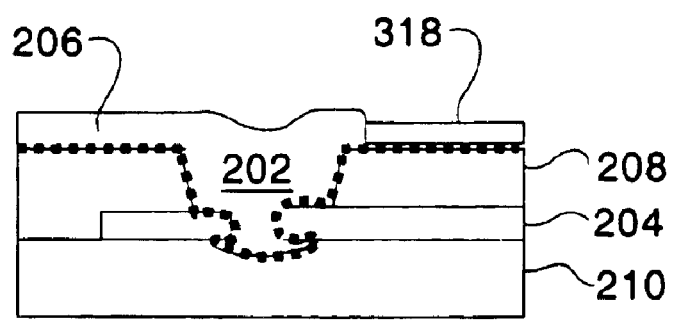

FIG. 3I illustrates the top conductor 206 above the second dielectric layer 208 as well as the via 202 substantially filling the first well 306, the via hole 214, and the anchor volume 314. In an embodiment, the top conductor 206 and via 202 comprise copper and may be formed by depositing copper through an electrolytic plating process. In other embodiments, the top conductor 206 may comprise nickel or aluminum. The electroplated copper that forms the top conductor 206 and the via 202 may attach to the surfaces on which the thin conductive layer 316 is exposed. The second dry film layer 318 may prevent copper from being electroplated on surfaces covered by the dry film layer 318. Thus, areas covered by the second dry film layer 318 may remain substantially free from the electroplated copper. Since the first well 306, the via hole 214, and the anchor volume 314 may all be filled with the top conductor, the bottom conductor 204 may be mechanically interlocked by the via 202.

Figure 3J:
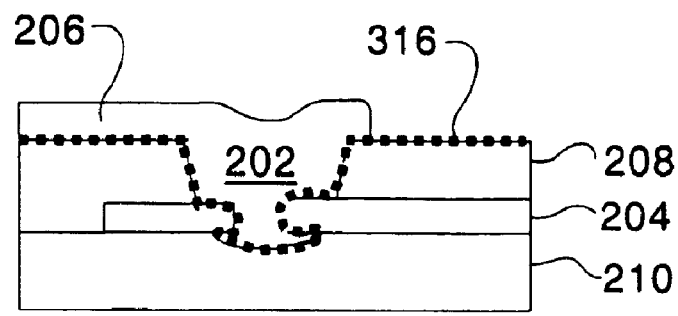

In FIG. 3J the second dry film layer 318 has been removed. In an embodiment, the second dry film layer 318 may be removed with a chemical stripping process. The thin conductive layer 316 that was beneath the second dry film layer 318 may be exposed by removal of the second dry film layer 318.

Figure 3K:
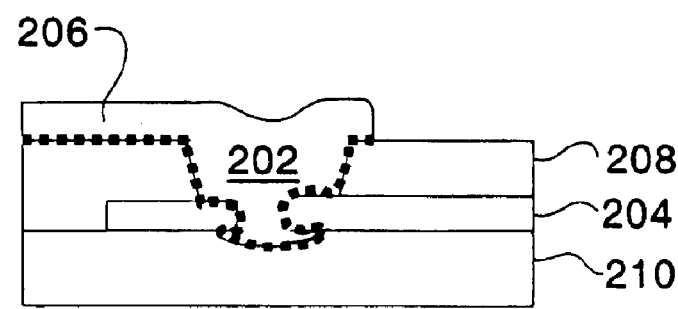

In FIG. 3K the exposed thin conductive layer 316 has been removed. In an embodiment, this may be done by etching away the thin conductive layer 316. In an embodiment, a wet etch solution with less than about 40 grams per liter of $H_2SO_4$, or a solution with about 5 grams per liter to about 7 grams per liter of $H_2O_2$ may be used. Removing the exposed thin conductive layer 316 may prevent possible short circuits formed by the thin conductive layer 316 connecting the top conductor 206 or via 202 to a different conductor or via on the second dielectric layer 208.

Figure 3L:
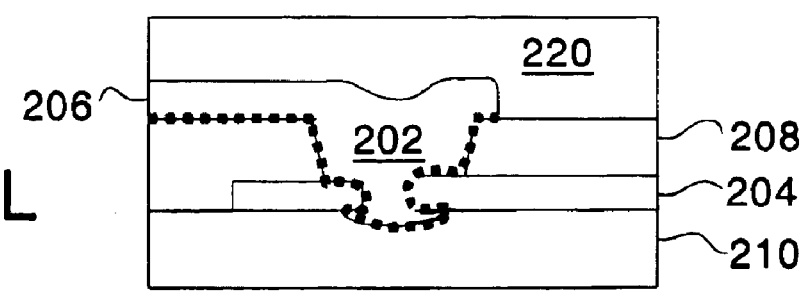

In FIG. 3L a third dielectric layer 220 has been added above the top conductor 206, the via 202, and the second dielectric layer 208. Thus, FIG. 3L illustrates an embodiment of a completed via 202 that electrically connects the top conductor 206 to the bottom conductor 204, similar to that shown in FIG. 2A. The third dielectric layer 220 may protect the top conductor 206 and via 202 from things such as corrosion and mechanical damage. The third dielectric layer 220 may act as the second dielectric layer 208 if a via is formed between a conductor above the third dielectric layer 220 and a conductor on the second dielectric layer 208 or a conductor on the same layer as the bottom conductor 204. In an embodiment, the top conductor 206 and the via 202 may be left uncovered, without a third dielectric layer 220.

The foregoing description of the embodiments of the invention has been presented for the purposes of illustration and description. It is not intended to be exhaustive or to limit the invention to the precise forms disclosed. This description and the claims following include terms, such as left, right, over, under, upper, lower, first, second, etc. that are used for descriptive purposes only and are not to be construed as limiting. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A device, comprising:

a die;

a printed circuit board; and a substrate located between the die and the printed circuit board, the substrate electrically and mechanically connecting the die to the printed circuit board, the substrate comprising:

a first dielectric layer, the first dielectric layer having side walls that define a first well;

a second dielectric layer with side and bottom walls that define an anchor volume with a width;

a bottom conductor between the first and second dielectric layers, the bottom conductor having side walls that define a via hole extending from the first well to the anchor volume, the via hole having a width smaller than the width of the anchor volume; and a conductive material that substantially fills the first well, the via hole, and the anchor volume.

2. The device of claim 1, further comprising a top conductor, wherein the conductive material electrically connects the top conductor to the bottom conductor.

3. The device of claim 2, wherein the conductive material and the top conductor comprise copper.

4. The device of claim 1, wherein the first well extends to the bottom conductor.

5. The device of claim 1, wherein the first well has a width in a range from about 62 micrometers to about 82 micrometers.

6. The device of claim 5, wherein the first well has a width in a range from about 69 micrometers to about 75 micrometers.

7. The device of claim 1, wherein the width of the via hole is in a range of about 35 micrometers to about 45 micrometers.

8. The device of claim 1, wherein the width of the anchor volume is in a range of about 69 micrometers to about 75 micrometers.

9. The device of claim 1, wherein the substrate further comprises a core, multiple conductive layers on each side of the core, and layers of dielectric material separating the conductive layers, each of the core, conductive layers and layers of dielectric material being between the die and the printed circuit board.

* * * * *